US009856557B1

(12) United States Patent
Yi et al.

(10) Patent No.: US 9,856,557 B1
(45) Date of Patent: Jan. 2, 2018

(54) FABRICATION OF A MULTI-LAYERED MAGNETIC ELEMENT

(71) Applicant: Seagate Technology LLC, Cupertino, CA (US)

(72) Inventors: Jae-Young Yi, Prior Lake, MN (US); Eric W. Singleton, Maple Plain, MN (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 15/004,343

(22) Filed: Jan. 22, 2016

(51) Int. Cl.
| C23C 14/34 | (2006.01) |
| C23C 14/02 | (2006.01) |
| C23C 14/14 | (2006.01) |
| C23C 14/08 | (2006.01) |
| C23C 14/54 | (2006.01) |
| H01J 37/34 | (2006.01) |

(52) U.S. Cl.
CPC .......... *C23C 14/3464* (2013.01); *C23C 14/02* (2013.01); *C23C 14/081* (2013.01); *C23C 14/14* (2013.01); *C23C 14/3414* (2013.01); *C23C 14/541* (2013.01); *H01J 37/3429* (2013.01)

(58) Field of Classification Search
CPC ..... C23C 14/02; C23C 14/541; C23C 14/564; H01J 37/3476; H01J 37/32724
USPC ......................................... 204/192.2, 298.09
See application file for complete search history.

(56) References Cited

U.S. PATENT DOCUMENTS

| 5,008,217 | A | | 4/1991 | Case et al. |
| 5,584,971 | A | * | 12/1996 | Komino ............... C23C 14/541 |
| | | | | 118/723 E |
| 5,660,114 | A | | 8/1997 | Gruber |
| 5,660,930 | A | | 8/1997 | Bertero et al. |
| 5,764,567 | A | * | 6/1998 | Parkin .................... B82Y 10/00 |
| | | | | 257/E43.004 |
| 5,799,860 | A | | 9/1998 | Demaray et al. |
| 5,831,851 | A | | 11/1998 | Eastburn et al. |
| 5,972,184 | A | | 10/1999 | Hollars et al. |
| 6,156,171 | A | | 12/2000 | Hollars et al. |
| 6,217,272 | B1 | | 4/2001 | Felsenthal et al. |
| 6,530,733 | B2 | | 3/2003 | Klein et al. |
| 6,682,288 | B2 | | 1/2004 | Klein et al. |
| 6,821,912 | B2 | | 11/2004 | Klein et al. |
| 6,835,290 | B2 | | 12/2004 | Reiter et al. |
| 7,602,033 | B2 | | 10/2009 | Zhao et al. |
| 8,619,394 | B1 | * | 12/2013 | Park .................... G11B 5/3909 |
| | | | | 29/603.07 |
| 8,701,753 | B2 | | 4/2014 | Yi et al. |
| 8,711,528 | B1 | | 4/2014 | Xiao et al. |
| 8,968,536 | B2 | | 3/2015 | Allen et al. |
| 9,034,150 | B2 | | 5/2015 | Inturi et al. |
| 9,034,491 | B2 | | 5/2015 | Sankar et al. |
| 9,142,226 | B2 | | 9/2015 | Inturi et al. |

(Continued)

*Primary Examiner* — Rodney McDonald
(74) *Attorney, Agent, or Firm* — Westman, Champlin & Koehler, P.A.

(57) ABSTRACT

A fabrication method that includes cryogenically cooling a multi-layered structure, which includes a barrier layer, in a multi-purpose chamber having a single enclosure around at least one sputtering target and a substrate support. The method also includes depositing a ferromagnetic layer over the barrier layer of the cryogenically cooled multi-layered structure in the single enclosure when the multi-layered structure is supported on the substrate support.

7 Claims, 8 Drawing Sheets

(56) References Cited

U.S. PATENT DOCUMENTS

2013/0176836 A1 7/2013 Zheludev et al.
2014/0113828 A1 4/2014 Gilbert et al.

* cited by examiner

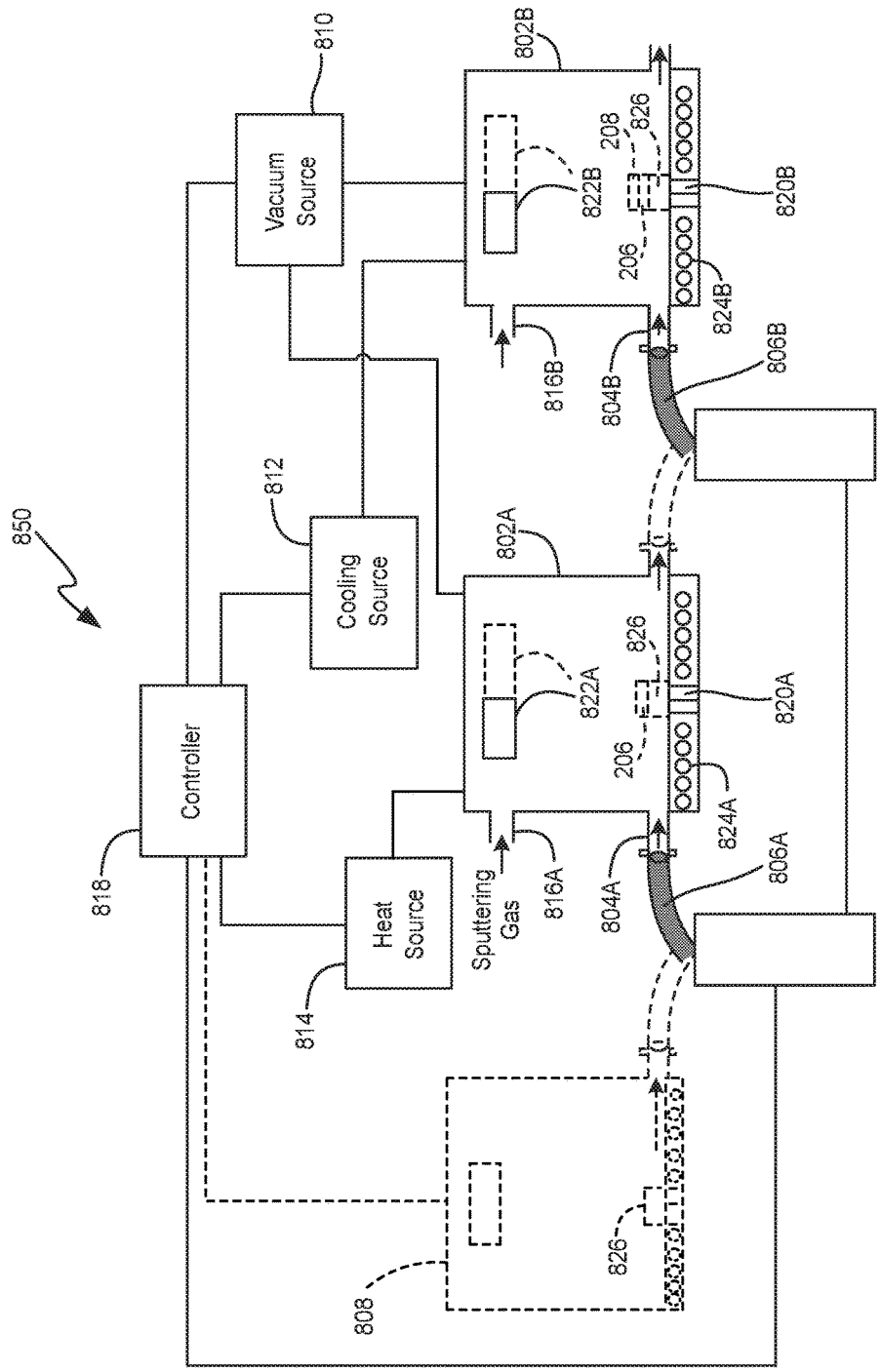

FABRICATION OF A MULTI-LAYERED MAGNETIC ELEMENT

BACKGROUND

Data storage devices commonly have a recording head that includes a read transducer that reads information from a data storage medium and a write transducer that writes information to a data storage medium.

In magnetic data storage devices such as disc drives, a multi-layered magnetic element such as a magnetoresistive (MR) sensor may be employed as the read transducer to read a magnetic signal from the magnetic media. The MR sensor, which may be a Giant Magnetoresistive (GMR) sensor or a Tunnel Magnetoresistive (TMR) sensor, has an electrical resistance that changes in response to an external magnetic field. This change in electrical resistance can be detected by processing circuitry in order to read magnetic data from the adjacent magnetic media.

With ever-increasing levels of recording density in disc drives and a need for faster data transfer speeds, the read transducer needs to have correspondingly better data-reproducing capabilities. A fabrication process utilized to form the read transducer impacts its data-reproducing capability. In general, fabrication processes utilized to form multi-layered magnetic elements have an impact on the performance of the magnetic elements.

SUMMARY

The present disclosure relates to fabrication of a multi-layered magnetic element. In one embodiment, a multi-layered structure that includes a barrier layer is cryogenically cooled in a multi-purpose chamber that includes a single enclosure around at least one sputtering target and a substrate support. A ferromagnetic layer is deposited over the barrier layer of the cryogenically cooled multi-layered structure in the single enclosure when the multi-layered structure is supported on the substrate support.

Other features and benefits that characterize embodiments of the disclosure will be apparent upon reading the following detailed description and review of the associated drawings.

BRIEF DESCRIPTION OF THE DRAWINGS

FIG. 8B is a diagrammatic illustration of an example apparatus that may be utilized to carry out deposition of TMR sensor layers or MTJ layers over a wafer in accordance with another embodiment.

DETAILED DESCRIPTION OF ILLUSTRATIVE EMBODIMENTS

The present application relates to the fabrication of multi-layered magnetic elements such as magnetoresistive (MR) sensors by a process that involves carrying out at least a cooling step and a deposition step of the magnetic element fabrication in-situ in an evacuated (i.e., vacuum) chamber. However, prior to providing additional details regarding the different embodiments, a general description of wafer fabrication for forming a read/write head of a disc drive is provided below in connection with FIG. 1.

Figure 1:
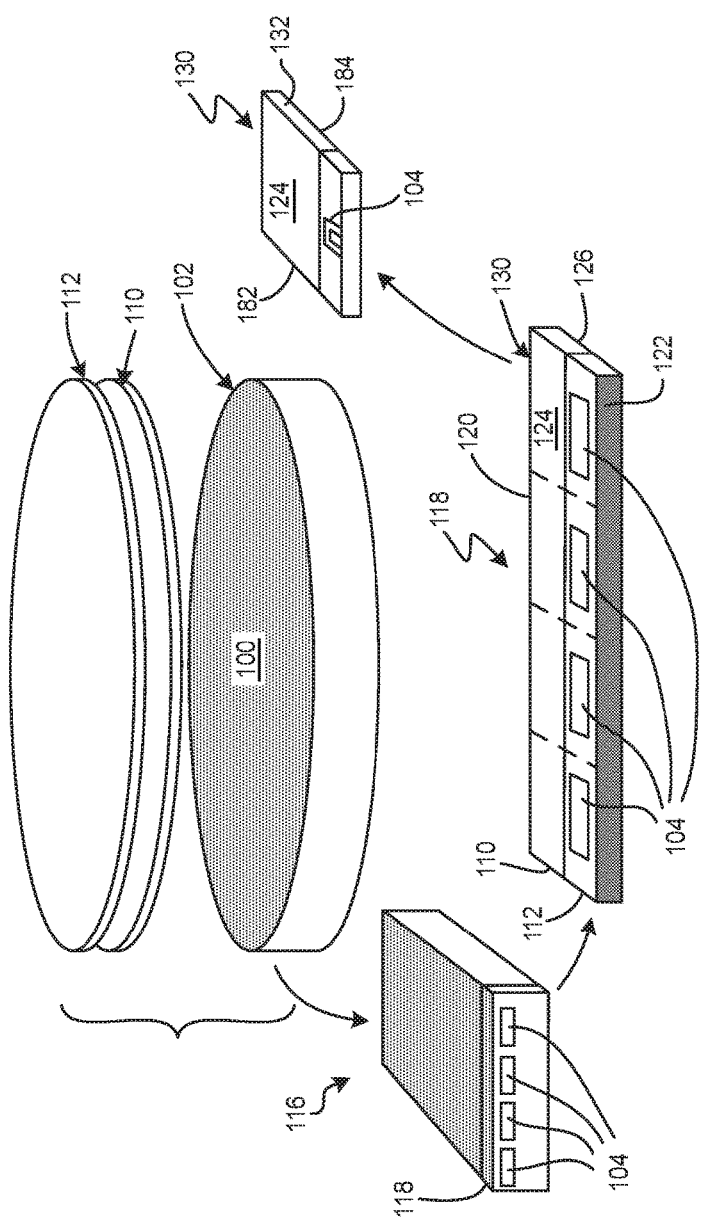
FIG. 1 is a schematic illustration of a wafer fabrication sequence for heads of a data storage device.

FIG. 1 is a schematic illustration of a wafer fabrication sequence for heads of a data storage device. As shown in FIG. 1, multiple thin film deposition layers are deposited on a surface 100 of a wafer or substrate 102 to form one or more transducer elements 104 (illustrated schematically in FIG. 1). As shown, the multiple deposition layers include one or more read element layers 110 and write element layers 112. The read and write element layers 110, 112 are illustrated schematically in FIG. 1. Following deposition of the read and write element layers 110, 112, the wafer 102 is sliced into a bar chunk 116. The bar chunk 116 includes a plurality of slider bars 118 (one slider bar 118 is shown exploded from the chunk 116).

The sliced bars 118 have a leading edge 120, a trailing edge 122, a bearing surface (for example, an air bearing surface (ABS)) 124 and a back surface 126. After the bars 118 are sliced from chunks 116, the transducer elements 104 (read and write elements) deposited on the wafer 102 are orientated along the air bearing surface(s) 124 at the trailing edge 122 of the slider bar 118. The slider bar 118 is sliced to form the heads 130. Typically, the bar 118 is lapped and the bearing surface(s) 124 are etched prior to slicing the bar 118 to form the individual heads 130. Illustratively, the wafer 102 is formed of a ceramic material such as alumina ($Al_2O_3$) titanium carbide (Ti—C). The read and write elements are fabricated on the ceramic or substrate material of the wafer 102 to form a slider body 132 of the head, and the one or more deposition layers 110, 112 form the transducer elements 104 along the trailing edge 122 of the slider body 132.

In some embodiments, transducer elements 104 can comprise a read element that may utilize tunnel magnetoresistance (TMR) or giant magnetoresistance (GMR) effects. A TMR read element/sensor typically has a stack of layers with a configuration in which two ferromagnetic layers are separated by a thin non-magnetic dielectric layer referred to herein as a tunneling barrier layer.

Figure 2:
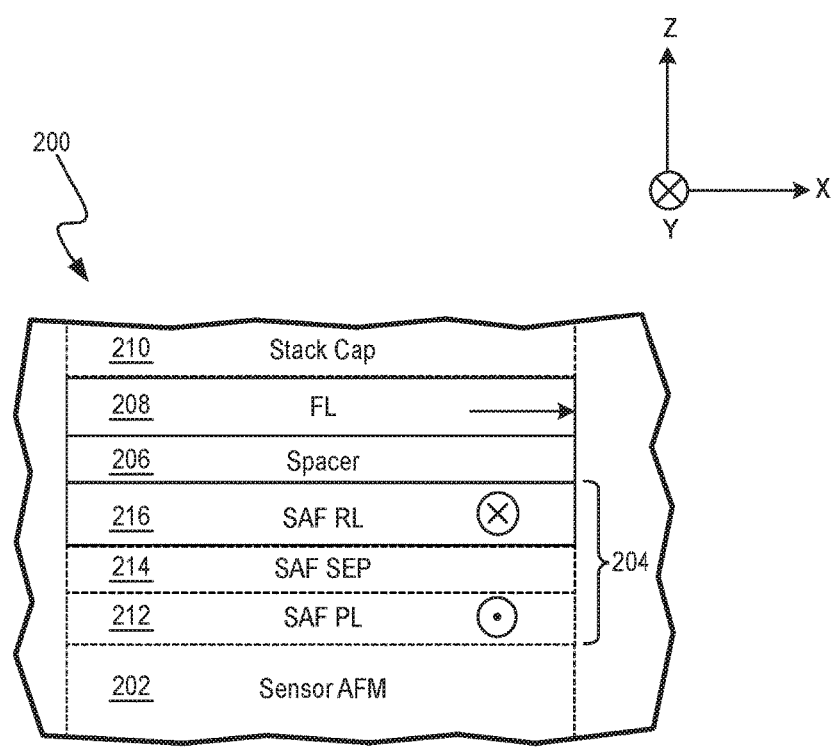
FIG. 2 is a schematic diagram of a cross-section of a portion of a recording head.

FIG. 2 is a schematic block diagram illustrating a bearing surface view an example TMR read sensor 200. In the embodiment of FIG. 2, TMR sensor 200 includes a plurality of layers including a sensor antiferromagnetic (AFM) layer 202, sensor stack synthetic antiferromagnetic (SAF) structure 204, a tunneling barrier layer 206, a free layer or sensing layer 208 and a stack cap 210. It should be noted that layers 202, 204, 206, 208 and 210 may be a part of deposition layer 110 of FIG. 1. In the interest of simplification, additional layers such as shield layers, seed layers, etc., are not shown in FIG. 2. Further, it should be noted that the example of the TMR sensor 200 shown in FIG. 2 is merely illustrative and there may be variations in structures of different layers across different embodiments. For example, in an alternate embodiment, free layer 208 may be a multi-layered structure with any suitable number of layers. Further, in some embodiments, sensor AFM layer 202 may be recessed from the bearing surface to reduce a thickness of TMR read sensor 200 at the bearing surface along the z-axis, thereby reducing a spacing between shields (not shown) positioned above and below the read sensor 200. The thickness of TMR sensor 200 may be reduced further by employing a single magnetic layer instead of the tri-layered SAF structure. Is such an embodiment, a magnetization of the single magnetic layer may be "self-pinned" in, for example, a direction perpendicular to the bearing surface using shape anisotropy. Due to the self-pinning of the magnetic layer, sensor AFM layer 202 may be entirely eliminated. Dashed lines are used in FIG. 2 to represent one or more layers that may be optional.

In the embodiment shown in FIG. 2, the sensor SAF structure 204 includes a pinned layer 212, a thin separation layer 214, which may comprise a metal such as ruthenium (Ru) in some embodiments, and a reference layer 216. The magnetic moments of each of the pinned layer 212 and the reference layer 216 are not allowed to rotate under magnetic fields in the range of interest (for example, magnetic fields generated by the bits of data stored on data discs). The magnetic moments of the reference layer 216 and the pinned layer 212 are generally oriented normal to the plane (i.e., the y direction) of FIG. 2 and anti-parallel to each other.

The magnetic moment of the free layer 208 is free to rotate under the influence of an applied magnetic field in a range of interest. The tunneling barrier layer 206 is sufficiently thin that quantum mechanical electron tunneling occurs between the reference layer 216 in the SAF structure 204 and the free layer 208. The electron tunneling is electron-spin dependent, making the magnetic response of the TMR sensor 200 a function of the relative orientations and spin polarizations of the reference layer 216 and the free layer 208. The highest probability of electron tunneling occurs when the magnetic moments of the reference layer 216 and the free layer 208 are parallel, and the lowest probability of electron tunneling occurs when the magnetic moments of the reference layer 216 and the free layer 208 are antiparallel. Accordingly, the electrical resistance of the TMR sensor 200 changes in response to an applied magnetic field. The data bits on the data discs in the disc drive may be magnetized in a direction normal to the plane of FIG. 2, either into the plane of the figure, or out of the plane of the figure. Thus, when the TMR sensor 200 passes over a data bit, the magnetic moment of the free layer 208 is rotated either into the plane of FIG. 2 or out of the plane of FIG. 2, changing the electrical resistance of the TMR sensor 200. The value of the bit being sensed by the TMR sensor 200 (for example, either 1 or 0) may therefore be determined based on the current flowing from a first electrode (not shown) to a second electrode (not shown) connected to the TMR sensor 200.

In general, formation of TMR sensors such as 200 involves depositing multiple layers such as those described in connection with FIG. 2 over a wafer or substrate such as 102 of FIG. 1. After the TMR sensor layers and any other suitable layers are deposited on the wafer, additional steps such as slicing of the wafer with the deposited layers into individual heads is carried out as described above in connection with FIG. 1. At least some steps in the formation of a TMR sensor are shown in the flow diagram of FIG. 3 and are listed below. It should be noted that the steps listed below may also be used to form magnetic tunnel junctions (MTJs) for magnetic random access memory (MRAM) devices.

Figure 3:
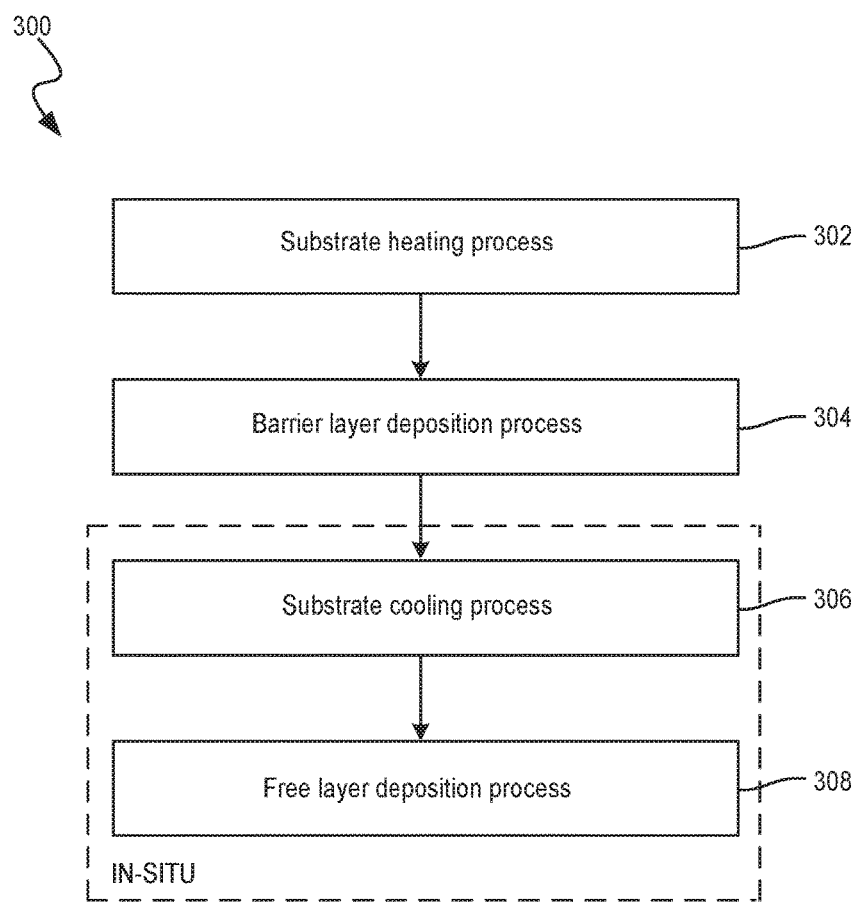
FIG. 3 is a simplified flow diagram of a method embodiment.

FIG. 3 is a simplified flow diagram 300 that includes certain steps in the formation of a TMR sensor or MTJs for MRAM devices. At step 302, a substrate that includes a magnetic layer (for example, a reference layer) is heated to a suitable temperature. At step 304, a barrier layer is deposited over the reference layer of the heated substrate. It should be noted that, in some embodiments, the barrier layer may be deposited over the reference layer at room temperature in one chamber and the resulting structure may be subjected to heat treatment in another chamber. At step 306, the substrate with the barrier layer is cryogenically cooled. At step 308, a free layer is deposited over the cryogenically cooled substrate. In accordance with some embodiments, at least steps 306 and 308 are performed in-situ within a same evacuated chamber. Experimental results obtained from TMR sensors formed using such an in-situ process are described below in connection with FIGS. 4-7.

Figure 4:
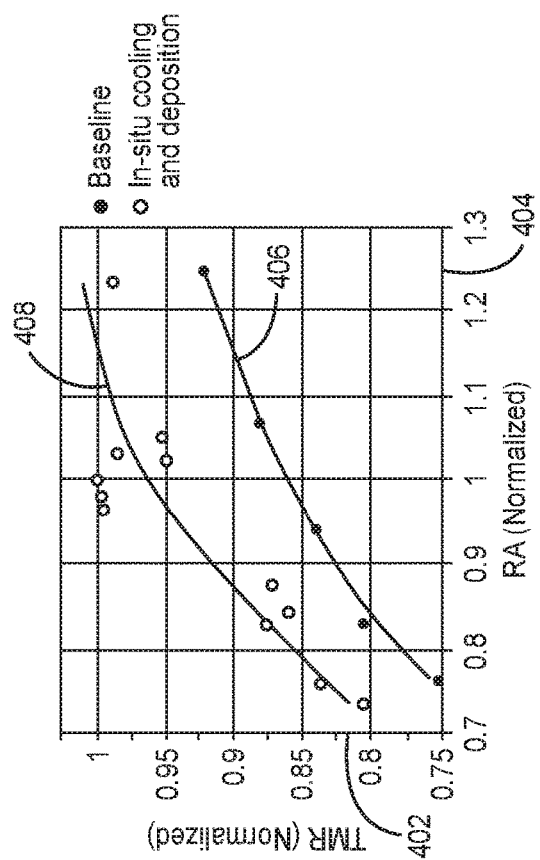

FIG. 4 illustrates graphs of normalized median tunneling magnetoresistance (TMR) values as a function of normalized median resistance area product (RA) values for lots of TMR sensors. Each dot in the graph(s) represents results obtained for a single lot (i.e., TMR sensors on a single wafer). A vertical axis 402 indicates normalized median TMR and a horizontal axis 404 indicates normalized median RA. In FIG. 4, curve 406 is constructed to fit results obtained for lots of baseline TMR sensors formed by a process that employs separate cooling and deposition chambers (i.e., a process in which steps 306 and 308 of FIG. 3 are carried out in separate chambers). Curve 408 is constructed to fit results obtained for lots of TMR sensors formed by an in-situ deposition and cooling process (i.e., a process in which steps 306 and 308 of FIG. 3 are carried out in a same chamber). As can be seen in FIG. 4, curve 408 shows substantially higher TMR values than curve 406. Specifically, as can be seen in FIG. 4, for a given median RA value, a median TMR value for TMR sensors formed by the in-situ cooling and deposition process is increased by about 10% relative to the median TMR value of the baseline TMR sensors. Accordingly, forming TMR sensors by the in-situ cooling and deposition process results in a substantial increase in TMR values over corresponding TMR values of baseline sensors, thereby substantially improving sensor data-reproducing capabilities.

Figure 5:
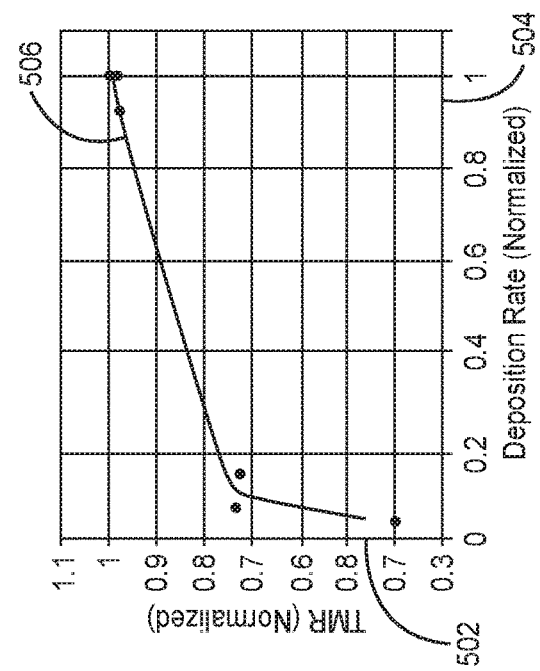
FIGS. 4, 5, 6 and 7 are plots of experimental results.

FIG. 5 illustrates a graph of normalized median TMR values as a function of a normalized free layer (FL) deposition rate in an embodiment in which steps 306 and 308 of FIG. 3 are carried out in a same evacuated chamber. A vertical axis 502 indicates normalized median TMR and a horizontal axis 504 indicates a normalized FL deposition rate. Curve 506 is constructed to fit results obtained for different lots of TMR sensors. As can be seen in FIG. 5, substantial improvements in TMR are obtained as the FL deposition rate increases.

Figure 6:
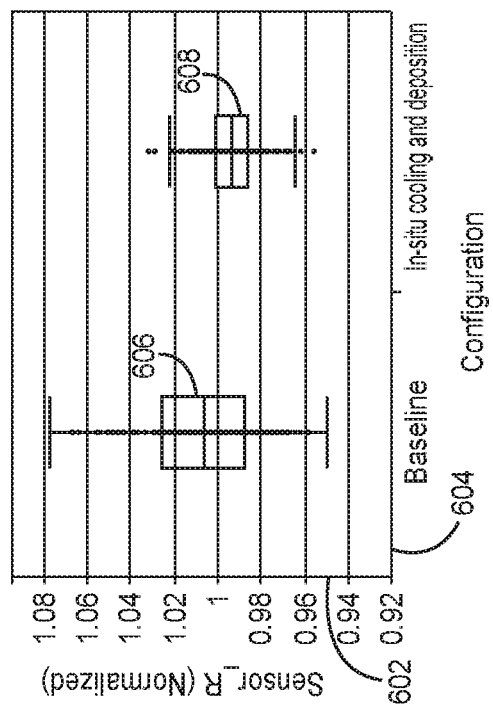

FIG. 6 illustrates distributions (also called scattergrams) of normalized values of sensor resistance for different lots of TMR sensors. A vertical axis 602 indicates normalized sensor resistance values of two TMR sensor lots 1 and 2 that are displayed along a horizontal axis 604, which represents lot identifiers (IDs).

Lot 1 at 606 represents results obtained for a lot of baseline TMR sensors formed by process that employs separate cooling and deposition chambers (i.e., a process in which steps 306 and 308 of FIG. 3 are carried out in separate chambers). Lot 2 at 608 represents results obtained for a lot of TMR sensors formed by in-situ deposition and cooling processes (i.e., a process in which steps 306 and 308 of FIG. 3 are carried out in a same chamber).

As can be seen in FIG. 6, there is substantially less scatter in the numerical values corresponding to TMR sensors tested in lot 2 (608) relative to baseline TMR sensors of lot 1 (606).

Figure 7:
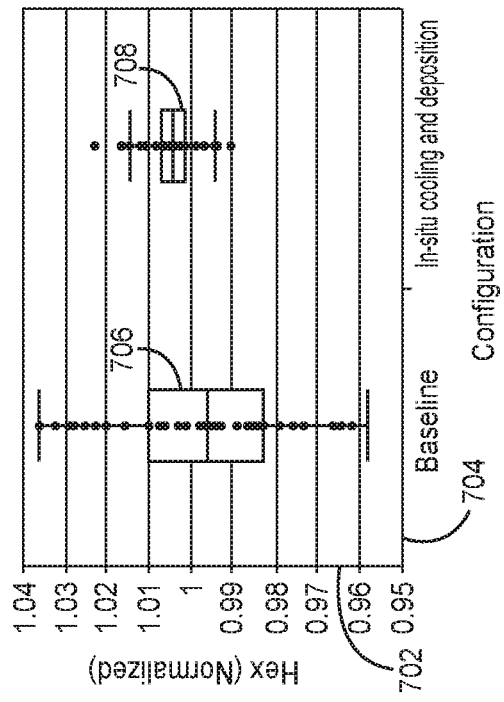

FIG. 7 illustrates distributions of normalized values of exchange coupling fields (Hex) between free layers and the reference layers for different lots of TMR sensors. A vertical axis 702 represents normalized values of the exchange coupling fields between respective free layers and reference layers of two TMR sensor lots 1 and 2 that are displayed along a horizontal axis 704, which represents lot identifiers (IDs).

Lot 1 at 706 represents results obtained for a lot of baseline TMR sensors formed by processes that employ separate cooling and deposition chambers (i.e., a process in which steps 306 and 308 of FIG. 3 are carried out in separate chambers). Lot 2 at 708 represents results obtained for a lot of TMR sensors formed by in-situ deposition and cooling processes (i.e., a process in which steps 306 and 308 of FIG. 3 are carried out in a same chamber).

As can be seen in FIG. 7, there is substantially less scatter in the numerical values (sigma reduced by about 50%) corresponding to TMR sensors tested in lot 2 (708) relative to baseline TMR sensors of lot 1 (706). This substantial and unexpected reduction in variance results in a corresponding unexpected increase in sensor yield, thereby having a strong positive impact on cost savings and profitability.

As described above, by carrying out TMR sensor fabrication steps such as 306 and 308 of FIG. 3 in a same chamber, several unexpected improvements described above in connection with FIGS. 4-7 are obtained. At least some of the steps involved in depositing the TMR sensor layers over a wafer may be carried out by an apparatus of the type shown in FIG. 8A, 8B or 8C.

Figure 8A:
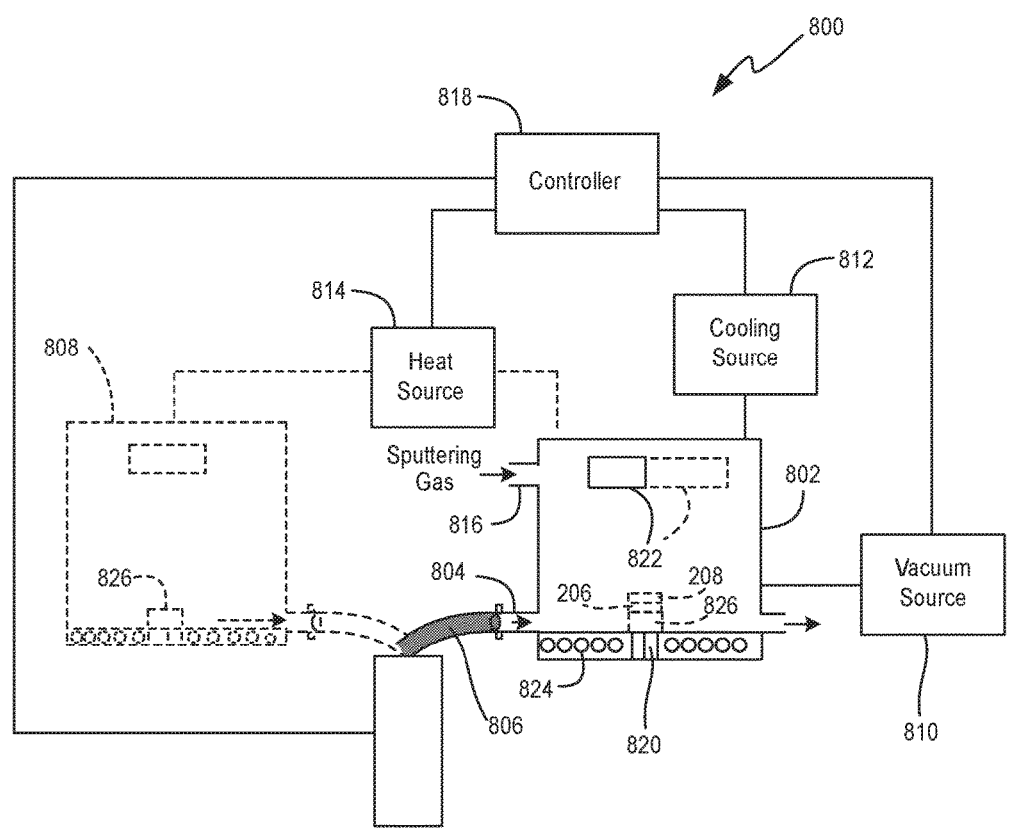
FIG. 8A is a diagrammatic illustration of an example apparatus that may be utilized to carry out deposition of tunnel magnetoresistance (TMR) sensor layers or magnetic tunnel junction (MTJ) layers over a wafer in accordance with one embodiment.
Figure 8C:
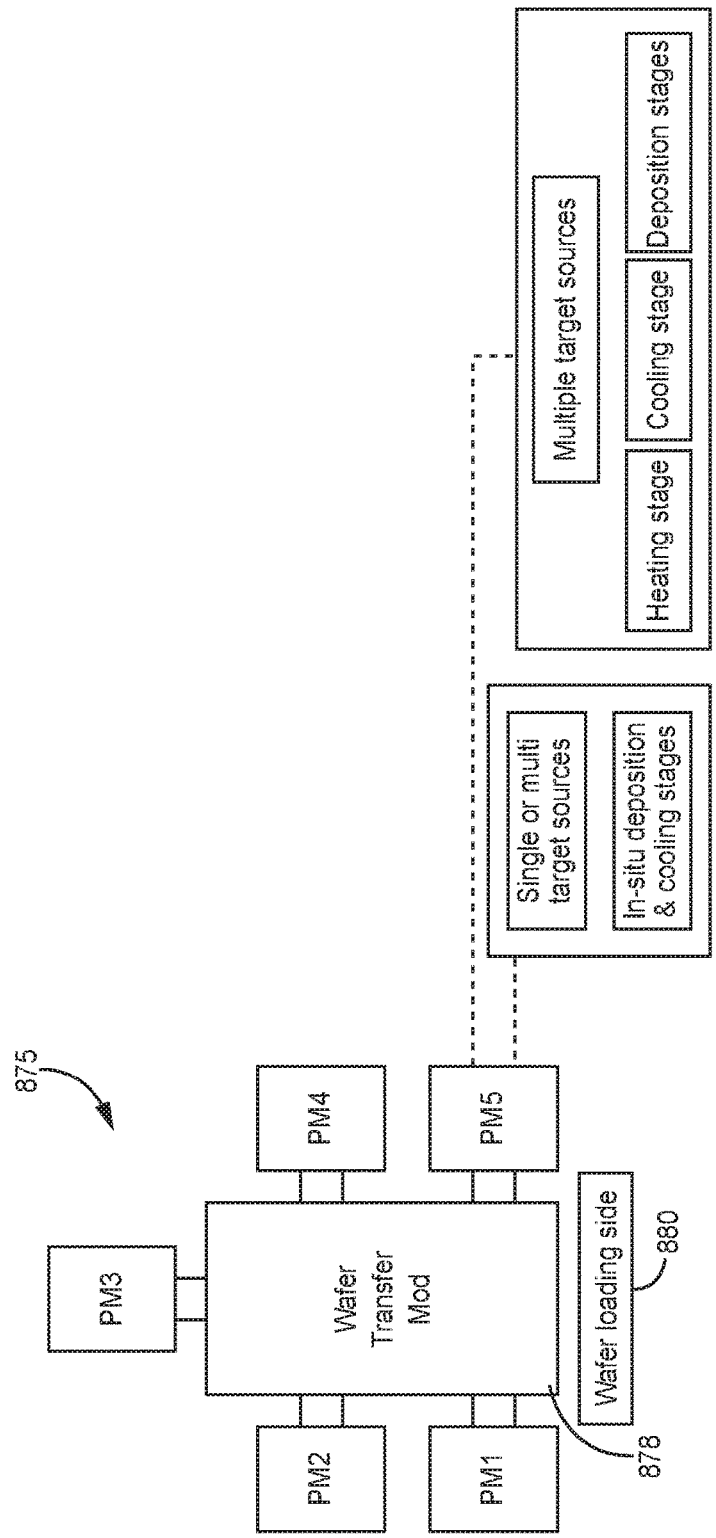
FIG. 8C is a diagrammatic illustration of an example apparatus that may be utilized to carry out deposition of TMR sensor layers or MTJ layers over a wafer in accordance with yet another embodiment.

FIG. 8A is a diagrammatic illustration of an example apparatus 800 that may be utilized to carry out deposition of TMR sensor layers over a wafer in accordance with one embodiment. Apparatus 800 includes at least one multi-purpose chamber 802, a loading/input element (for example, a load lock) 804 via which a substrate is introduced into the chamber 802, a robot arm 806 and one or more previous processing stage elements, which are denoted by dashed box 808. Other elements of apparatus 800 may include a vacuum source 810, a cooling source 812, a heat source 814, a sputtering gas inlet 816 and a controller 818. It should be noted that the cooling source 812 and heat source 814 are represented by boxes positioned outside the multi-purpose chamber 802 in FIG. 8A in the interest of simplification. However, in different embodiments, at least portions of elements 812 and 814 may be positioned within multi-purpose chamber 802. Controller 818, which may include any suitable hardware/firmware, controls operation of the different components of apparatus 800. As will be described further below, in some embodiments, both heating and cooling of multi-layered structures is carried out within multi-purpose chamber 802. In alternate embodiments, which are also described further below in connection with FIG. 8B, only one of cooling or heating of a multi-layered structure is carried out within a particular chamber.

Multi-purpose chamber 802 may be of any suitable shape and, in some embodiments, may be formed of a material that is capable of withstanding very low temperatures and substantially elevated temperatures. Chamber 802 is configured such that it may be evacuated by vacuum source 810, which may be a vacuum pump, for example. Chamber 802 includes at least one substrate support 820 and one or more sputtering targets 822. A transport element 824 may also be included within chamber 802 to receive the wafer or substrate via loading/input element 804 and to transport the wafer or substrate to substrate support 820 to be deposited upon. It should be noted that the loading/input element 804 may include a load lock that has a chamber within which pressure may be reduced to a level that is substantially equal to the pressure within chamber 802 when it is evacuated by the vacuum source 810. It should also be noted that suitable valves (not shown) may be included in the load lock chamber 804 to help ensure that vacuum is maintained within the load lock chamber 804 when the substrate is being introduced into the multi-purpose chamber 802 via the load lock chamber 804.

In some embodiments, one or more of layers 202, 204, 206 (shown in FIG. 2) may be deposited on the wafer or substrate by previous processing stage elements 808 before the multi-layered structure including the wafer and the previously deposited element(s) is introduced into multi-purpose chamber 802. In a particular embodiment, layers 202 and 204 are deposited over the wafer or substrate by previous processing stage elements 808 and the resulting multi-layered structure 826 is introduced into chamber 802 for further processing. The transfer of the multi-layered structure 826 from element 808 to chamber 802 is carried out with the help of robot arm 806, which transports that the multi-layered structure 826 from element 808 to loading/input element 804 that introduces structure 826 into chamber 802. In such an embodiment, once the multi-layered structure 826 is within the chamber 802, it is heated to an elevated temperature (for example, between 200 and 300 degrees Celsius) with the help of heat source 814. When the multi-layered structure 826 is at a desired elevated temperature, a barrier layer 206 is deposited on the multi-layered structure 826. Specifically, to carry out the barrier layer deposition, the multi-layered structure 826 is positioned on the substrate support 820 such that layer 204 of the multi-layered structure 826 is exposed to be deposited upon. A sputtering target 822 that includes a barrier layer material (for example, a dielectric material such as MgO) is positioned over the multi-layered structure 826. A suitable sputtering gas is then introduced into chamber 802 and the sputter deposition process is carried out until a barrier layer 206 of a suitable thickness is formed. In some embodiments, the dielectric material sputtering target 822 is substantially larger than the multi-layered structure 826 to enable proper deposition of the barrier layer 206 without rotation of the multi-layered structure 826. In other embodiments, the multi-layered structure 826 may be rotated by using any suitable technique while the deposition of the barrier layer 206 is being carried out. In such embodiments, the sputtering target or sputtering targets 822 utilized to provide the barrier layer material(s) may be of any suitable size.

Upon completion of the barrier layer deposition, the resulting multi-layered structure 826 including the barrier layer 206 is cryogenically cooled (for example, to a temperature between 50 and 200 degrees Kelvin) within chamber 802 with the help of cooling source 812. Once the multi-layered structure 826 with the barrier layer 206 is properly cooled, a ferromagnetic material is deposited on the barrier layer 206 to provide a sensor free layer 208. In some embodiments, the deposition of the ferromagnetic layer 208 on the barrier layer 206 is carried out at a relatively high rate (for example, between 1 and 3 angstroms per second). It should be noted that, in some embodiments, the free layer 208 may comprise a plurality of layers and deposition of each of the plurality of layers may be carried out within the same chamber 802. A different sputtering target 822 may be utilized for each different one of the plurality of layers that form free layer 208 because each layer may be formed of one or more different materials. In some embodiments, the multi-layered structure 826 with the barrier layer 206 is not rotated during the deposition of free layer 208. In such embodiments, the sputtering target or sputtering targets 822 utilized to provide the free layer material(s) may be substantially larger than the multi-layered structure 826 with the barrier layer 206 in order for the material(s) to be uniformly deposited on the barrier layer 206. In other embodiments, the multi-layered structure 826 with the barrier layer 206 may be rotated during the deposition of the free layer 208. In such embodiments, the sputtering target or sputtering targets 822 utilized to provide the free layer material(s) may be of any suitable size.

FIG. 8B is a diagrammatic illustration of an example apparatus 850 that may be utilized to carry out deposition of TMR sensor layers over a wafer in accordance with another embodiment. In the embodiment of FIG. 8B, the heating of the multi-layered structure 826 and the deposition of the barrier layer 206 is carried out in one chamber (denoted by 802A in FIG. 8B) and the cooling of the resulting structure and the deposition of the free layer 208 on the barrier layer 206 is carried out in another chamber (denoted by 802B in FIG. 8B). Each of chambers 802A and 802B may be evacuated by one or more vacuum sources 810. In chamber 802A, the substrate support is denoted by 820A and the transport element is denoted by 324A. In chamber 802B, those elements are denoted by 820B and 824B, respectively. A sputtering gas inlet of chamber 802A is denoted by 816A and a similar inlet of chamber 802B is denoted by 816B.

As in the case of the embodiment described above in connection with FIG. 8A, layers 202 and 204 are deposited over the wafer or substrate by previous processing stage elements 808. The resulting multi-layered structure 826 is introduced into chamber 802A for further processing. The transfer of the multi-layered structure 826 from element 808 to chamber 802A is carried out with the help of robot arm 806A, which transports that the multi-layered structure 826 from element 808 to loading/input element 804A that introduces structure 826 into chamber 802A. Once the multi-layered structure 826 is within the chamber 802A, it is heated to an elevated temperature (for example, between 200 and 300 degrees Celsius) with the help of heat source 814. When the multi-layered structure is at a desired elevated temperature, barrier layer 206 is deposited on the multi-layered structure within chamber 802A.

In the embodiment of FIG. 8B, upon completion of the barrier layer deposition, the multi-layered structure 826 with the barrier layer 206 is transferred from chamber 802A to chamber 802B. The transfer is carried out by robot arm 806B, which transports the multi-layered structure 826 with the barrier layer 206 from chamber 802A to loading/input element 804B that introduces the structure into chamber 802B. Once the multi-layered structure 826 with the barrier layer 206 is within the chamber 802B, it is cryogenically cooled (for example, to a temperature between 50 and 200 degrees Kelvin) within chamber 802B with the help of cooling source 812. When the multi-layered structure 826 with the barrier layer 206 is properly cooled, a ferromagnetic material is deposited on the barrier layer 206 to provide a sensor free layer 208.

In the apparatus embodiments described above in connection with FIGS. 8A and 8B, the chambers or process modules 802, 802A and 802B are linearly arranged, with robot arms 806, 806A and 806B utilized to transfer the substrate(s) between the linearly arranged processing modules or chambers. However, in an example tool configuration 875 shown in the top-down view of FIG. 8C, the process modules (denoted by PM1, PM2, PM3, PM4 and PM5) are positioned on different sides of a wafer transfer module 878, which may include a robot arm. A wafer loading element 480 is included on one side of the apparatus/tool 875. In one embodiment, at least one of PM1, PM2, PM3, PM4 or PM5, is used to carry out multiple process steps. In one embodiment, the multiple process steps may include in-situ deposition and cooling processes (i.e., steps 306 and 308 of FIG. 3). In another embodiment, the multiple process steps may include in-situ heating, cooling and deposition stages (for example, steps 302-308 of FIG. 3).

In the sensor fabrication embodiments described above in connection with FIGS. 8A, 8B and 8C, the cryogenic cooling of the multi-layered structure 826 with the barrier layer 206 and the deposition of the free layer 208 is carried out in-situ within the same chamber or process module. As described above in connection with FIGS. 4-7, this in-situ cooling and free layer deposition process yields sensors with substantially higher TMR values than the TMR values of sensors with equivalent stacked layers, which are formed by a process in which the cryogenic cooling of the structure is carried out in one chamber and the subsequent free layer deposition is carried out in a separate chamber. By removing the need for transferring the cryogenically cooled structure from a cooling chamber to a different chamber for the free layer deposition to be carried out, the exposure of the structure during the transfer and the time associated with the transfer and other delays due to employing different process chambers is eliminated in the in-situ process.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be reduced. Accordingly, the disclosure and the figures are to be regarded as illustrative rather than restrictive.

One or more embodiments of the disclosure may be referred to herein, individually and/or collectively, by the term "invention" merely for convenience and without intending to limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is provided to comply with 37 C.F.R. §1.72(b) and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments.

The above-disclosed subject matter is to be considered illustrative, and not restrictive, and the appended claims are intended to cover all such modifications, enhancements, and other embodiments, which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A method comprising:
    depositing a barrier layer on a multi-layered structure in a first chamber;
    transporting the multi-layered structure with the deposited barrier layer to a second chamber, the second chamber being a multi-purpose chamber that comprises a single enclosure around at least one sputtering target and a substrate support;
    cryogenically cooling the multi-layered structure with the barrier layer in the multi-purpose chamber that comprises the single enclosure around the least one sputtering target and the substrate support; and
    depositing a ferromagnetic layer over the barrier layer of the cryogenically cooled multi-layered structure with the barrier layer in the single enclosure when the multi-layered structure with the barrier layer is supported on the substrate support,
    wherein no transportation of the multi-layered structure is carried out between the cryogenic cooling of the multi-layered structure with the barrier layer and the deposition of the ferromagnetic layer over the barrier layer.

2. The method of claim 1, wherein the barrier layer is deposited on the multi-layered structure from a barrier material target of the at least one sputtering target, and wherein the barrier material target is substantially larger than the multi-layered structure.

3. The method of claim 1, wherein the ferromagnetic layer is deposited over the barrier layer from a ferromagnetic material target of the at least one sputtering target, and wherein the ferromagnetic material target is substantially larger than the multi-layered structure with the barrier layer.

4. The method of claim 1, wherein the ferromagnetic layer is deposited at a high rate between about 1 angstrom per second to about 3 angstroms per second.

5. The method of claim 1, wherein cryogenically cooling the multi-layered structure with the barrier layer comprises cooling the multi-layered structure with the barrier layer to a temperature between about 50 degrees Kelvin and about 200 degrees Kelvin.

6. The method of claim 1 and wherein the at least one sputtering target comprises a plurality of sputtering targets including a barrier material target and a ferromagnetic material target.

7. The method of claim 6 and wherein the ferromagnetic material target is a compound target comprising a first magnetic alloy element and a second magnetic alloy element.

* * * * *